United States Patent [19]
Peckerar et al.

[11] Patent Number: 5,703,373
[45] Date of Patent: Dec. 30, 1997

[54] ALIGNMENT FIDUCIAL FOR IMPROVING PATTERNING PLACEMENT ACCURACY IN E-BEAM MASKS FOR X-RAY LITHOGRAPHY

[75] Inventors: Martin C. Peckerar, Silver Spring; Christie Marrian, Marbury, both of Md.

[73] Assignee: The United States of America as represented by the Secretary of the Navy, Washington, D.C.

[21] Appl. No.: 552,651

[22] Filed: Nov. 3, 1995

[51] Int. Cl.$^6$ ............................................. H01J 37/30
[52] U.S. Cl. ................................ 250/491.1; 250/492.2
[58] Field of Search ........................... 250/491.1, 492.2

[56] References Cited

U.S. PATENT DOCUMENTS

| | | | |
|---|---|---|---|
| 4,467,211 | 8/1984 | Smith et al. | 250/491.1 |
| 4,871,919 | 10/1989 | Donohue et al. | 250/491.1 |
| 4,885,472 | 12/1989 | Young | 250/491.1 |
| 5,136,169 | 8/1992 | Smith et al. | 250/491.1 |

*Primary Examiner*—Bruce Anderson
*Attorney, Agent, or Firm*—Thomas E. McDonnell; John J. Karasek

[57] ABSTRACT

The present invention is a fiducial electron beam detector including an electron beam absorber layer having one or more apertures for transmitting an electron beam, and a conductive or semiconductive structure adapted to produce a current in response to an incident electron beam transmitted through an aperture. When electrons from the electron beam strike this structure, a flow of electrons is created which may be monitored using any of the known methods for detecting current flow. The present invention is also a fiducial electron beam detector including a first semiconductor layer for electron collection, a first responsive layer of essentially parallel lines of conductive material oriented in one direction, where these conductive lines are separated by nonconductive material, and each of the lines is adapted for producing a current responsive to an electron beam, a second semiconductor layer adapted for electron collection, and a second responsive layer of essentially parallel lines of conductive material oriented in another direction, where these conductive lines are separated by nonconductive material, and each of the fines is adapted for producing a current responsive to an electron beam. Diode layers separate each of the semiconductor and responsive layers, to restrict current flow to a single direction. The present invention is also a method for monitoring the position of an electron beam on a film, in an area wherein the beam can create a useful image on the film.

18 Claims, 6 Drawing Sheets

ALIGNMENT FIDUCIAL FOR IMPROVING PATTERNING PLACEMENT ACCURACY IN E-BEAM MASKS FOR X-RAY LITHOGRAPHY

BACKGROUND OF THE INVENTION

1. Field of the Invention

The invention relates to calibrating the position of an electron beam relative to a workpiece, typically an e-beam sensitive film on a substrate, to improve the accuracy and repeatability of electron beam lithography.

2. Description of the Related Art

Electron beam (or e-beam) lithography [hereinafter EBL] uses an electron beam to write patterns, typically mask patterns, in electron sensitive layers (resists) on substrates. Electron beam technology has advanced to the point where very highly focused electron beams ($\geq 10$ nm) can be used in lithography. However, to make optimal use of electron beams in such lithographic applications as mask making, the position of a writing electron beam must be observable, controllable, and repeatable.

Fiducials are structures used to calibrate the position of an energy beam (such as an electron beam) relative to a workpiece (such as substrate coated with an electron sensitive layer) by generating a signal when the energy beam passes over the fiducial mark. Typically, these fiducials are positioned in a series (referred to as a datum aperture) at the edges of the workpiece (i.e., outside the writing area).

Since the alignment of the energy beam typically is calibrated at a position that is remote from the writing area, it is necessary to assume that the beam does not drift significantly between calibration checks. This assumption is not always warranted.

Other practitioners have proposed remedies to this problem. See U.S. Pat. No. 5,136,169, issued Aug. 2, 1992 to Smith et al., incorporated herein by reference, for all purposes, in its entirety. The Smith patent teaches the use of fiducials which will emit, e.g., secondary electrons when exposed to an energy beam, and that this secondary electron emission will be different from the secondary electron emission associated with areas between fiducial marks.

This approach has its own shortcomings. For example, this method relies upon secondary effects, such as secondary electrons, backscattered electrons, and photon emission (e.g., fluorescence). These secondary effects are relatively insensitive, because only a fraction of the incident beam is converted into signal (whether that signal is in the form of photons, secondary electrons, etc.). This insensitivity is compounded by the fact that, rather than measuring an absolute signal (i.e., the presence or absence of a signal), this method requires the detection of a change in a signal.

Another shortcoming of this approach is that it does not provide for a removable, portable, fiducial pattern which may be reused for multiple workpieces. In addition to the economy inherent in reuse, this also helps to assure uniformity from device to device, if the same fiducial pattern is used over and over again.

Another shortcoming of this approach is that many of the fluorophores that would be used in this approach saturate easily, and are easily damaged by moderately dense electron beams.

Another shortcoming of this approach is that it does not provide true x-y coordinate information. For example, this approach does not provide a way of distinguishing the signal from adjacent fiducials, and if the drift of the electron beam exceeds the spacing between adjacent fiducials, the correction signal will be off by this spacing.

The method taught by Smith et al. does not completely overcome the shortcomings of the earlier art. In Smith's preferred embodiment, the fiducial marks are positioned outside the writing area. Consequently, the potential for electron beam drift has not been obviated. Also, in this system there is an inherent trade off between resist sensitivity and the ability to align. A more sensitive e-beam resist would require a smaller incident alignment beam current (to prevent fogging). However, smaller beam currents would reduce the visibility of the alignment signal.

SUMMARY OF THE INVENTION

Accordingly, it is an object of this invention to provide a method of observing and controlling the position of an electron beam on a workpiece, having a fiducial pattern, removably fixed relative to the substrate, where the fiducial pattern embraces a working area where the electron beam can create a useful lithographic image with submicron precision.

It is a further object of this invention to provide a method of generating x-y coordinate information about the position of an electron beam with respect to a workpiece.

It is a further object of this invention to provide a method of observing and controlling the position of an electron beam on a workpiece, where the electron beam directly generates a position signal.

It is a further object of this invention to provide a removable, portable, fiducial pattern.

It is a further object of this invention to provide a method of generating magnification information about an electron beam scanner.

It is a further object of this invention to achieve these other objects in a manner that will avoid undesired patterning of a resist, to avoid the creation of undesired features on the developed resist, by minimizing localized electron beam doses.

These and additional objects of the invention are accomplished by the structures and processes hereinafter described.

The present invention is, in one aspect, a fiducial electron beam detector including an electron beam absorber layer having one or more apertures (e.g., holes or lines) for transmitting an electron beam, and a conductive or semiconductive structure adapted to produce a current in response to an incident electron beam transmitted through an aperture. When electrons from the electron beam strike this structure, an amplified flow of electrons is created which may be monitored using any of the known methods for detecting current flow, e.g., an ammeter or a voltmeter. Typically, the electron beam absorber layer will completely absorb incident electrons from the electron beam, so that no current is detected unless the electron beam passes through an aperture in the absorber layer. Typically, the apertures will be arranged in a regular grid pattern.

The present invention is, in another aspect, a fiducial electron beam detector including a first semiconductor layer for electron collection, a first responsive layer of essentially parallel lines of conductive material oriented in an x direction, where these conductive lines are separated by nonconductive material, and each of the lines is adapted for producing a current responsive to an electron beam, a second semiconductor layer adapted for electron collection, and a second responsive layer of essentially parallel lines of conductive material oriented in a y direction, where these conductive lines are separated by nonconductive material, and each of the lines is adapted for producing a current responsive to an electron beam. Diode layers separate each of the semiconductor and responsive layers, to restrict current flow to a single direction.

The present invention is, in another aspect, a method for monitoring the position of an electron beam on a film, in an area wherein said beam can create a useful image on said film with submicron precision, said electron beam generated by an electron beam source. This method has the steps of (a) positioning a fiducial electron beam detector having a fiducial pattern relative to the film so that the fiducial pattern is adjacent and parallel to an area on the film where the electron beam can create a useful image with submicron precision, on the opposite side of the film from the electron beam source, where the fiducial electron beam detector includes means for directly detecting primary electrons from the electron beam; (b) moving the electron beam across the film; (c) detecting a signal produced by the interaction of the electron beam with the fiducial pattern; and (d) comparing the detected signal with a predetermined signal to provide a position signal representative of the beam position with submicron precision.

The various embodiments of the invention exhibit excellent amplification, on the order of 10,000, so that an electron beam current of, e.g., 0.5 nA may produce an output signal of on the order of 5 µA. Accordingly, very small electron beam currents, less than the currents that would deliver a patterning dose to a resist layer, may be used in aligning the electron beam according to the invention. Moreover, because the fiducials may be positioned under the entire working surface of the resist, the need for the electron beam to return repeatedly to the same location or small number of locations of one or a small number of fiducials is obviated. Thus, one can avoid patterning undesired features into a resist layer, a significant advantage.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DETAILED DESCRIPTION OF THE PREFERRED EMBODIMENTS

Throughout the specification and the claims that follow, it should be understood the terms "upper" and "lower" are used as terms of convenience to distinguish various surfaces relative to each other. Neither "upper" nor "lower," as used in the specification and claims that follow, imply the orientation of any element with respect to the gravitational field.

Figure 1:
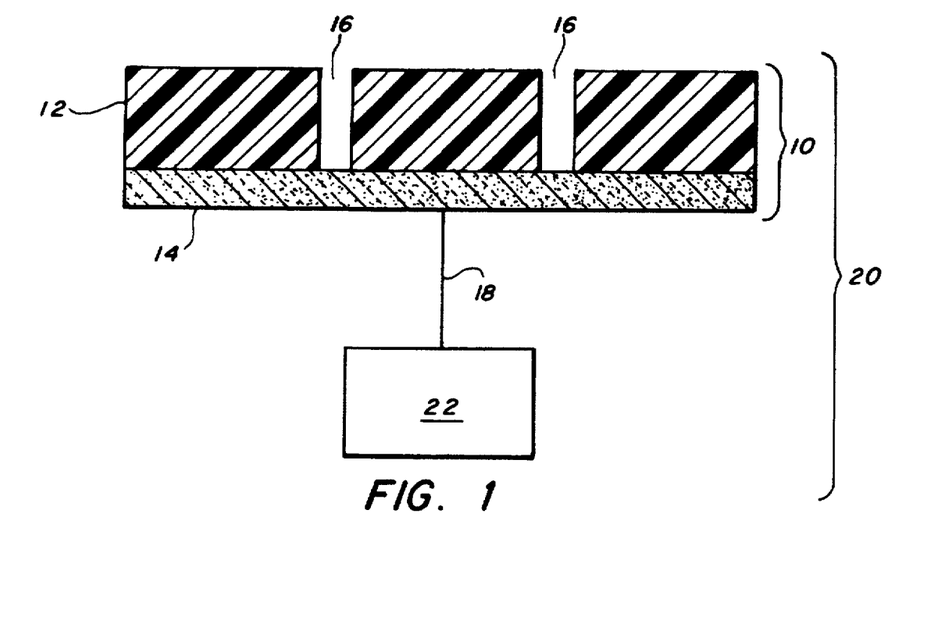
FIG. 1 shows a preferred embodiment of a fiducial electron beam detector according to the invention.

As shown in FIG. 1, a preferred embodiment of a fiducial electron beam detector according to the invention 10 comprises an electron beam absorber layer 12. This electron beam absorber layer 12 has one or more apertures 16 therethrough. The lower surface of the electron beam absorber layer 12 is positioned below and typically is in contact with the upper surface of a conductive or semiconductive structure 14 adapted to produce current in response to an incident electron beam, which can pass through the one or more apertures 16.

As an electron beam scans across the structure 10, the beam will be absorbed by the electron beam absorber layer 12, until the beam strikes an aperture 16. When the beam strikes the aperture 16, the beam is at least partially transmitted through the aperture 16, to the conductive or semiconductive structure 14. As electrons from the electron beam strike the conductive or semiconductive structure 14, the structure 14 absorbs these electrons, creating a current flow and/or a potential change. This current flow or potential change, which depends directly on the absorption and conduction of primary electrons from the electron beam, may be measured by appropriate circuitry for detecting current flow or potential change.

Thus, the fiducial electron beam detector according to the invention 10 typically will be coupled to means (e.g., an appropriate circuit or virtual circuit embodied in appropriate software in a programmed digital computer) 22 for detecting current flow or potential change in the conductive or semiconductive structure 14, to make a fiducial electron beam detecting system 20.

The electron beam absorber layer 12 preferably will completely block any incident electron beam that does not strike an aperture 16. Thus, the conductive or semiconductive structure 14 will have current flow or potential change only when the electron beam strikes an aperture. Thus, the signal detected by the current or potential detecting means 22 will be an absolute signal. In other words, the presence of a signal, rather than the change in a signal, will be associated with the alignment of the electron beam with an aperture 16. In another preferred embodiment, the electron beam absorber layer 12 will block enough of any incident electron beam that does not strike an aperture 16, so that any fraction of the electron beam that passes through the electron beam absorber layer 12 will be insufficient to be detectable by the means 22 for detecting current flow or potential change.

Apertures 16 preferably have about the same diameter as the FWHM (full width at half maximum intensity) of the electron beam. If the apertures 16 are much wider than the electron beam, then the detector 10 will not optimally position the electron beam. If, however, the apertures 16 are much narrower than the electron beam, then the electron beam absorber layer 12 will block much of the electron beam which could otherwise generate signal. Generally, apertures 16 will be between about 10% and about 1000% of the FWHM width of the electron beam, or between about 10 nm and about 100 nm wide.

Figure 2:
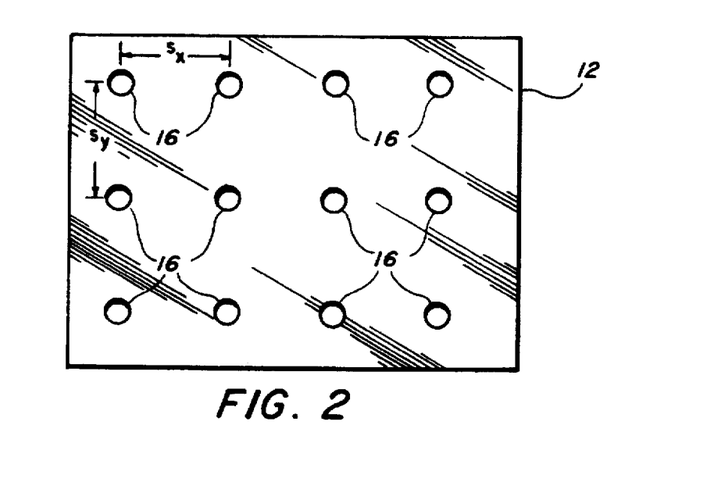
FIG. 2 shows a top view of a preferred embodiment of a fiducial electron beam detector according to the invention.

As shown in FIG. 2, a preferred embodiment of a fiducial electron beam detector according to the invention has a plurality of apertures 16 arranged in a regular grid pattern, preferably a regular x,y grid pattern. Preferably, adjacent apertures are separated by regular spaces $s_x$ and $s_y$. Preferably, $s_x$ and $s_y$ are greater than the FWHM width of the electron beam. Typically, $s_x=s_y$.

Figure 3:
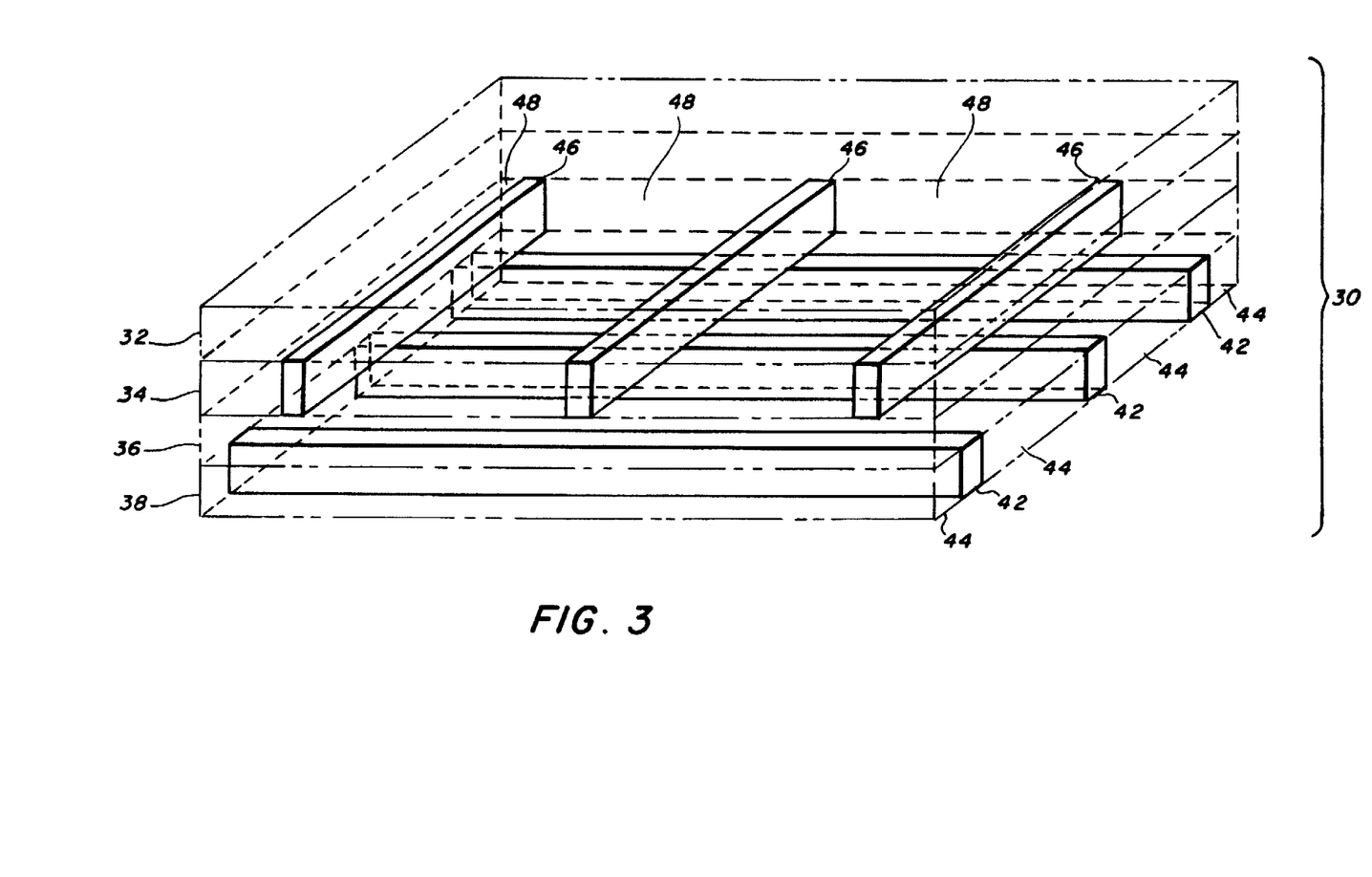
FIG. 3 shows an elevation view of another preferred embodiment of a fiducial electron beam detector according to the invention.

As shown in FIG. 3, another preferred embodiment of a fiducial electron beam detector according to the invention has a multilayer structure 30 where two layers 34,38 in the multilayer structure 30 include essentially parallel lines of conductive material 46,42 separated by nonconductive material 48,44.

This preferred embodiment of the invention has a first semiconductor layer 32 for electron collection. Contacting the lower surface of this first semiconductor layer 32 is a first responsive layer 34. This first responsive layer 34 includes one or more conductive lines 46. In the case where this first responsive layer 32 has a plurality of conductive lines 46, these lines are electrically insulated from each other, and preferably are parallel to each other. Thus, as shown in FIG. 3, the first responsive layer 34 has a plurality of parallel conductive lines 46 separated by nonconductive material 48.

Contacting the lower surface of this first responsive layer 34 is a second semiconductor layer 36 for electron collection. Contacting the lower surface of this second semiconductor layer 36 is a second responsive layer 38. This second responsive layer 38 includes one or more conductive lines 42. In the case where this second responsive layer 38 has a plurality of conductive lines 42, these lines are electrically insulated from each other, and preferably are parallel to each other. Thus, as shown in FIG. 3, the second responsive layer 38 has a plurality of parallel conductive lines 42 separated by nonconductive material 44.

The conductive lines 46 in the first responsive layer 34 cross paths with the conductive lines 42 in the second responsive layer 38 (i.e., the lines 46 in the first conductive layer 34 are not parallel with the lines 42 in the second responsive layer 38). Preferably, the conductive lines 46 in the first conductive layer 34 are perpendicular with the lines 42 in the second responsive layer 38. The direction of the preferably parallel conductive lines in either the first responsive layer 34 or the second responsive layer 38 may be arbitrarily designated as being parallel to an x axis, while the direction of the preferably parallel conductive lines in the remaining responsive layer may be arbitrarily designated as being parallel to a y axis.

Preferably, between each of these layers 32,34,36,38 is a thin film of diode material, to confine electrical current flow to a single direction. Preferably, the conductive lines are made from a noble metal. Au, Ag, Pt, and Cu are preferred. Other conductive metals, such as Al, are also acceptable. Suitable nonconductive materials for the first and second responsive layers 34,38 include $SiO_2$, $SiN_x$, AlGaAs, and $Al_2O_3$. Suitable materials for the first and second semiconductor layers 32,36 include Si, GaAs, and SiGe.

As an electron beam scans across the structure 30, the electron beam will penetrate the first semiconductor layer 32, and electrons from this beam will conduct through this layer 32 to the first responsive layer 34, without a significant amount of beam spreading or scatter. Thus, as the beam scans across the structure 30, electrons from the beam are directed into the first responsive layer 34, until the beam strikes a conductive line 46. When the beam strikes a conductive line 46, the conductive line 46 will absorb a fraction of the electrons in the beam, creating a current flow and/or a potential change. This current flow or potential change, which depends directly on the absorption and conduction of primary electrons from the electron beam, may be measured by appropriate circuitry for detecting current flow or potential change.

A critical feature of the present invention is that a sufficient fraction of the electron beam will pass through the first responsive layer 34, so that primary electrons from the beam may pass through the second semiconductor layer 36 and generate a signal in the second responsive layer 38, whether the electron beam is incident upon a conductive line 46 or a nonconductive material 48.

As an electron beam scans across the structure 30, the electron beam will penetrate the first semiconductor layer 32, the first responsive layer, and the second semiconductor layer, and electrons from this beam will conduct through these layers to the second responsive layer without a significant amount of beam spreading or scattering, except for the conduction of a fraction of electrons from the beam directed into a conductive line 46 in the first responsive layer. Thus, as the beam scans across the structure 30, electrons from the beam are directed into the second responsive layer 38, until the beam strikes a conductive line 42. When the beam strikes a conductive line 42, the conductive line 42 will absorb electrons in the beam, creating a current flow and/or a potential change. This current flow or potential change, which depends directly on the absorption and conduction of primary electrons from the electron beam, may be measured by appropriate circuitry for detecting current flow or potential change.

As used herein, the phrase "removably fixed" (or 'removable'), means that a fiducial electron beam detector may be rigidly attached to a workpiece, so that the electron beam may create a useful structure on the workpiece while the fiducial electron beam detector provides position information with respect to the electron beam, and that the fiducial electron beam detector subsequently may be removed from the workpiece, without damage to either the useful structure or the fiducial electron beam detector, and that the fiducial electron beam detector subsequently may be attached to another workpiece, so that the electron beam may create a useful structure on that workpiece while the fiducial electron beam detector provides position information with respect to the electron beam. Typical methods for removably fixing a workpiece, so that the electron beam may create a useful structure in the workpiece while the fiducial electron beam detector is attached to a workpiece will include clamping the fiducial electron beam detector to the workpiece and gluing the fiducial electron beam detector to a workpiece using an adhesive that may be dissolved without damage to either the workpiece or the detector.

Figure 4:
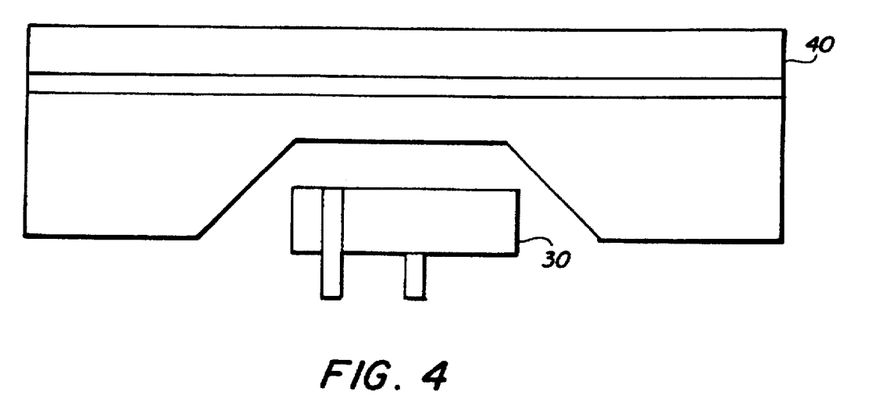
FIG. 4 shows a sectional view of a preferred embodiment of the invention positioned for operation below an electron beam mask workpiece.

As shown in FIG. 4, a preferred fiducial electron beam detector 30 according to the invention may be removably fixed relative to a workpiece 40 (fixing means not shown). The particular workpiece shown in FIG. 4 is an x-ray lithography mask. The workpiece may be, e.g., any mask or substrate comprising a membrane (or thin substrate). Examples include membrane masks for electron and ion beam projection lithography and ion and electron beam proximity lithography as well as masks for x-ray lithography. Electron beam lithography is currently the preferred method for making such masks.

The exemplary x-ray lithography mask shown is a thin membrane multilayer structure. The membrane has a top layer of resist (typically about 0.5 μm thick), a second layer of silicon (typically about 2 μm thick) contacting the lower surface of the resist layer, and a gold layer (typically less than about 1000 Å thick) which serves as a plating base contacting the lower surface of the silicon layer. Such a mask will pass more than 50% of an incident electron beam at 50 keV.

The detector preferably is positioned as close as practicable to the membrane, preferably within 5 μm of the membrane. Minimizing the space between the membrane and the detector will minimize the opportunity for an electron beam to be deflected between leaving the membrane and entering the detector.

Figure 5:
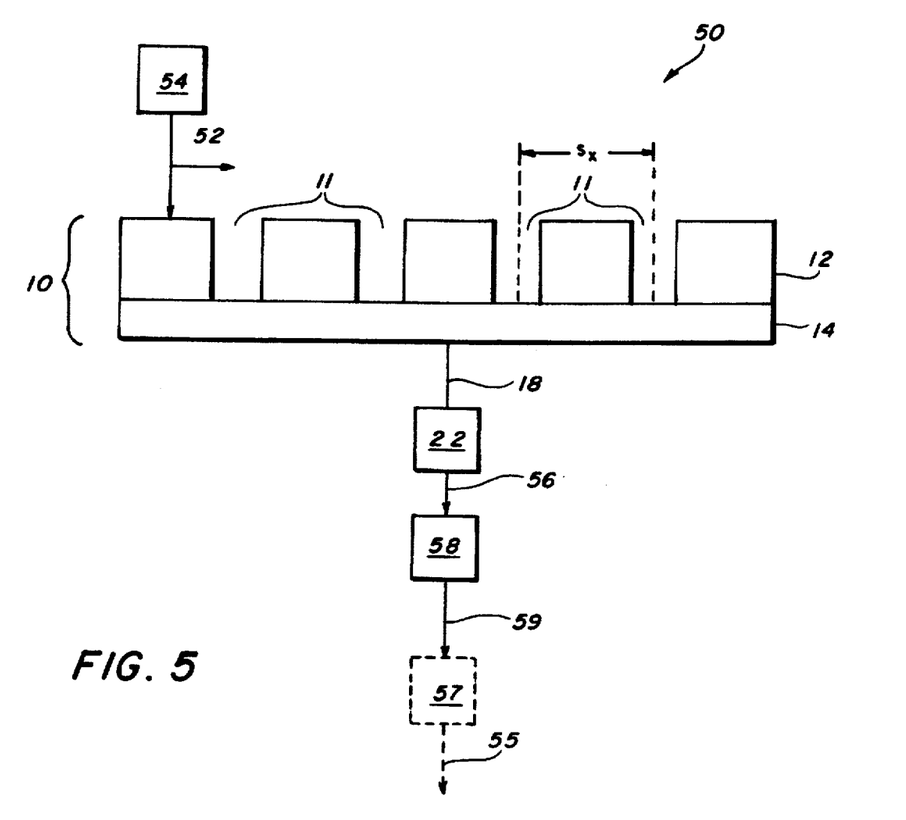
FIG. 5 shows a combined sectional view and block diagram of a preferred embodiment of the invention for practicing the invention in the frequency domain.

The invention may be practiced in the frequency domain for, e.g., calibrating the magnification of an electron beam scan generator. As shown in FIG. 5, a preferred embodiment of a frequency domain fiducial electron beam detector according to the invention 50 comprises an electron beam absorber layer 12. This electron beam absorber layer 12 has a plurality of more apertures 16 therethrough, where these apertures are evenly spaced (shown here as spaced distance $s_x$ apart). The spacing between these apertures may be made with high precision, so that the structure 10 may be used as a standard for frequency domain operation. The lower surface of the electron beam absorber layer 12 is positioned below and typically is in contact with the upper surface of a conductive or semiconductive structure 14 adapted to produce current in response to an incident electron beam, which can pass through the apertures 16.

As an electron beam 52 generated by an electron beam scan generator 54 scans across the structure 10 at a scan rate, the beam will be absorbed by the electron beam absorber layer 12, except when the beam is passing through an aperture 16. Thus, if the electron beam 52 scans across the structure 10 at a constant rate, the beam will pass through the apertures 16 at regular intervals. When the beam 52 passes through an aperture 16, the beam is at least partially transmitted through the aperture 16, to the conductive or semiconductive structure 14. As electrons from the electron beam 52 strike the conductive or semiconductive structure 14, the structure 14 absorbs these electrons, creating a current flow and/or a potential change. This current flow or potential change, which depends directly on the absorption and conduction of primary electrons from the electron beam, may be measured by appropriate circuitry for detecting current flow or potential change.

Thus, the fiducial electron beam detector according to the invention 10 typically will be coupled to means 22 for detecting current flow or potential change in the conductive or semiconductive structure 14. If the electron beam 52 scans across the structure 10 at a constant rate, the output of the means 22 for detecting current flow or potential change in the conductive or semiconductive structure will be a square wave having a frequency corresponding to the scan rate times the spacing between apertures 16.

The means 22 for detecting current flow or potential change in the conductive or semiconductive structure is connected to means 58 for performing a Fourier transform (usually using the fast Fourier transform algorithm), so that the time domain output signal 56 from the means 22 for detecting current flow or potential change is converted to a frequency domain signal 59. Since the accuracy of the magnification for an electron beam scan generator 54 is limited by the accuracy to which the scan rate is known, this embodiment of the invention provides magnification calibration.

This embodiment of the invention may be further modified by connecting the means 58 for performing a Fourier transform to means 57 for measuring the phase angle of the frequency domain output 59 of the means 58 for generating a Fourier transform. The output 55 of the means 57 for measuring the phase angle may be compared to the frequency domain signal 59, to improve the ability to locate the leading and/or trailing edges of the apertures 16. Points where a sharp change in the phase angle corresponds to a frequency domain peak may be associated with a leading or trailing edge of an aperture 16.

Having described the invention, the following example is given to illustrate specific applications of the invention. This specific example is not intended to limit the scope of the invention described in this application.

EXAMPLE 1

Figure 6:
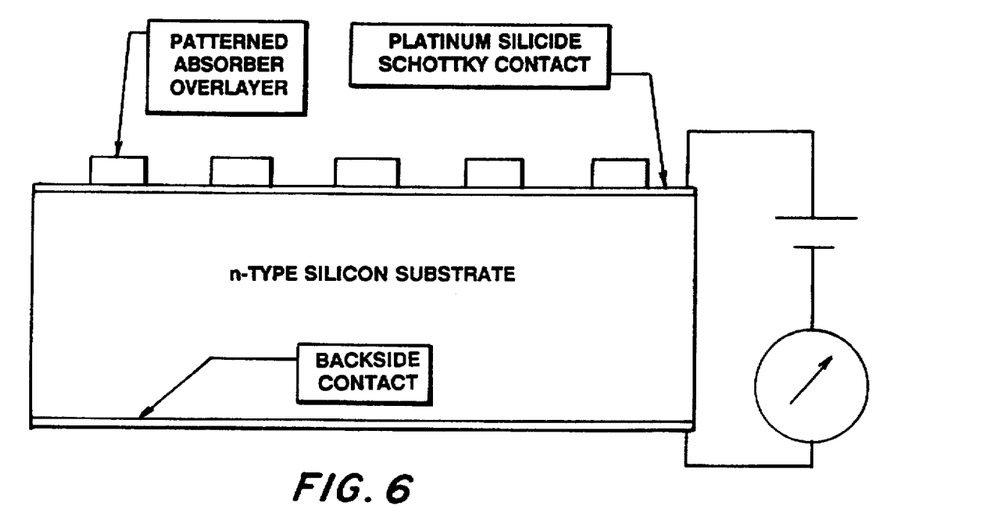
FIG. 6 shows a sectional view of a demonstration embodiment of the invention, according to Example 1.

Referring to FIG. 6, a Schottky barrier was formed by annealing (450° C. for 30 min. in $N_2$) a 30 nm Pt layer deposited on the surface of a clean 4–9 ohm cm n-type <100> Si wafer. The excess Pt was removed with aqua regia. The metal overlayer was evaporated over the Schottky barrier and patterned by photolithographically exposing resist which had been spin-coated over the overlayer. The pattern was then defined in the overlayer by wet etching. Evaporation of aluminum onto the backside of the wafer created the second contact for the diode. The patterned diodes were wirebonded and mounted to a standard flat pack and characterized in a Cambridge Model 200 scanning electron microscope (SEM). The diode was reverse biased with a 9 volt battery. The diode current was measured with a Keithley 427 Current Amplifier whose output was monitored on a LeCroy Model 9400A digital oscilloscope. The diode reverse bias leakage current was nulled (in the absence of an incident electron beam) with the Keithley amplifier prior to each measurement. Two different overlayers were used. First, 700 nm of aluminum was used, as simulations indicated that it would change from being essentially opaque to transparent over the electron energy range of 5 to 30 keV available in the SEM. The second layer studied was 490 nm of gold to investigate a simulation approach with a high atomic weight material.

Figure 7:
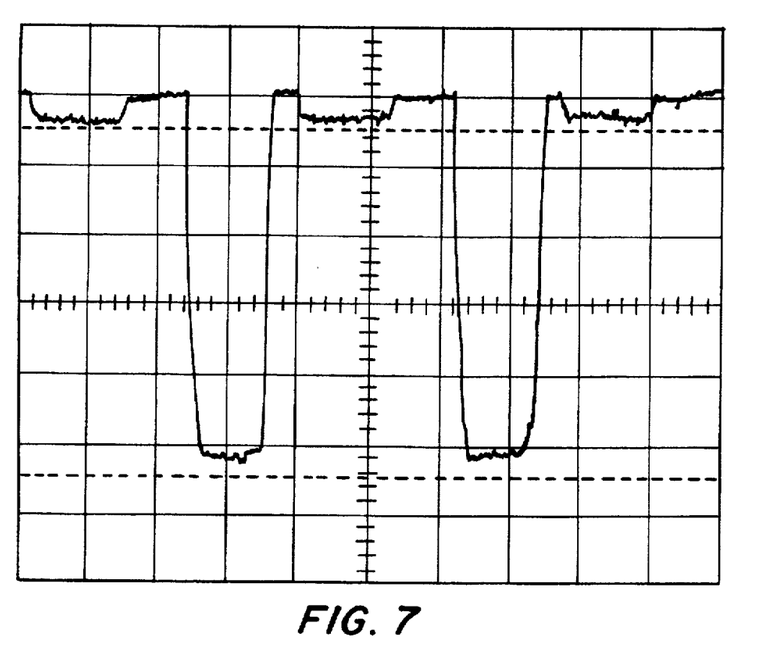
FIG. 7 shows modulation in the reverse biased diode current as a 30 kV electron beam was scanned over a 16 µm period grating in a gold film, according to Example 1.

The modulation in the reverse biased diode current as a 30 kV electron beam was scanned over a 16 μm period grating in the gold film, and is shown in FIG. 7. The beam current could not be measured directly and was estimated to be about 1 nA. The beam was scanned laterally at about 400 μm/s. The current minimum Ia (about 3.5 μA) corresponds to transmission through the gold film whereas the current maximum Io (about 14 μA) corresponds to the primary beam incident on the uncovered diode. The small 0.8 μA dip in the maximum current is due to attenuation by some residual aluminum on the surface between the gold patterns. Current noise is less than 200 nA peak to peak while the level of repeatability of the current level measurements over 1 mm² of the grating was 150 nA. The rise and fall times of diode current was found to be due mainly to the edge slope and roughness of the gold features. The current modulation from both patterned films is summarized in FIG. 8. Here, the points represent experimental measurements of the modulation in the diode current. The modulation, which is defined as $(Io-Ia)/Io$ is plotted as a function of the incident electron energy, Eo. For clarity, error bars corresponding to ±3% have not been included on the figure. This estimate was based on the repeatability of the measurements presented here.

Figure 8:
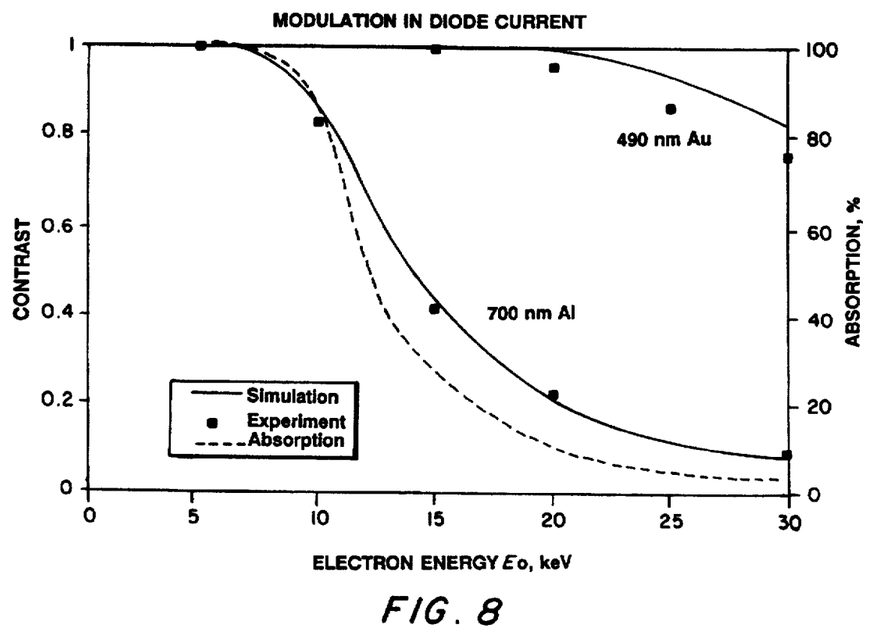
FIG. 8 shows the current modulation from gold and aluminum patterned films, according to Example 1.

At low energies (5 keV for the aluminum film) none of the electrons have sufficient energy to pass through the absorber so a contrast of unity is observed. As the incident electron energy is increased a higher fraction of the incident electrons have sufficient energy to pass through the absorber resulting in a decrease in the observed contrast. At 30 keV, the 700 nm aluminum film is essentially transparent so only a very small modulation in the diode current is observed. Simulation results using the screened Rutherford cross section are also included in the figure and are plotted as the continuous curves. The dotted line represents the fraction of the incident electrons, Na, which are absorbed in a 700 nm film of aluminum. This clearly underestimates the experimental data.

Most of the energy lost by an energetic electron as it passes through a material is dissipated by the creation of hole-electron pairs. These carriers create a current under the action of the electric field set up by the reverse bias across the diode. Thus, the current in the diode is proportional to the energy lost by the incident electron beam. The active volume of the diode comprises two regions. First, immediately below the Schottky barrier is the depletion region which extends to a depth of about 2 μm. Here all carriers generated are assumed to contribute to the diode current. For incident electron energies above 20 keV, the Grün range is greater than the depletion region depth, so the collection efficiency of the carriers created below the depletion region must be accounted for. Within a diffusion length of the depletion region, carriers can diffuse to the depletion region boundary and be collected. As the diffusion length (about 100 μm) is much greater than the Grün range, it can be estimated that about 50% of the carriers generated beneath the depletion region will be collected.

Figure 9:
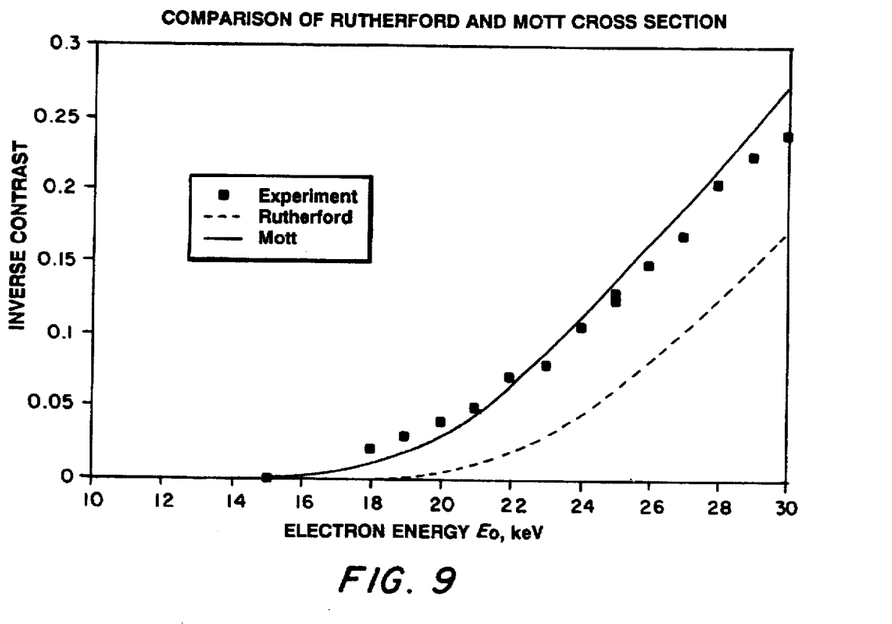
FIG. 9 shows experimental and modelled (Rutherford and Mott) cross-sections, according to Example 1.

An electron which has passed through the absorber will have lost some of its energy and hence will create fewer hole-electron pairs (and make a smaller contribution to the diode current) than an electron which is incident on the Schottky barrier directly, i.e., with its incident energy Eo. So to estimate the current modulation, the absorption fraction Na should be multiplied by a factor which accounts for the energy which is lost by the incident electrons as they pass through the absorber layer, i.e. the diode modulation should be given by:

$$Na\ Eo/Etr$$

where Etr is the average energy of the electrons when they enter the active part of the diode having passed through the absorber. This expression is plotted as the continuous line in FIG. 9, and shows agreement which is within the 43% accuracy of the experimental data for the aluminum film. The Monte Carlo simulation does not provide such good agreement with the measurements on the gold film. This data is reported in FIG. 9 as the contrast defined as:

$$Ia/Io$$

to emphasize the data where the transmission through the film is low. Also included in FIG. 9 are the results from simulations where the screened Rutherford cross section has been replaced with an empirical model of the Mott cross section. Closer agreement with experiment is obtained and the discrepancies are less than the estimated error of ±0.01 in the measurements as plotted here. For the aluminum film, there is essentially no difference between the simulation results with the two different scattering cross sections.

Figure 10:
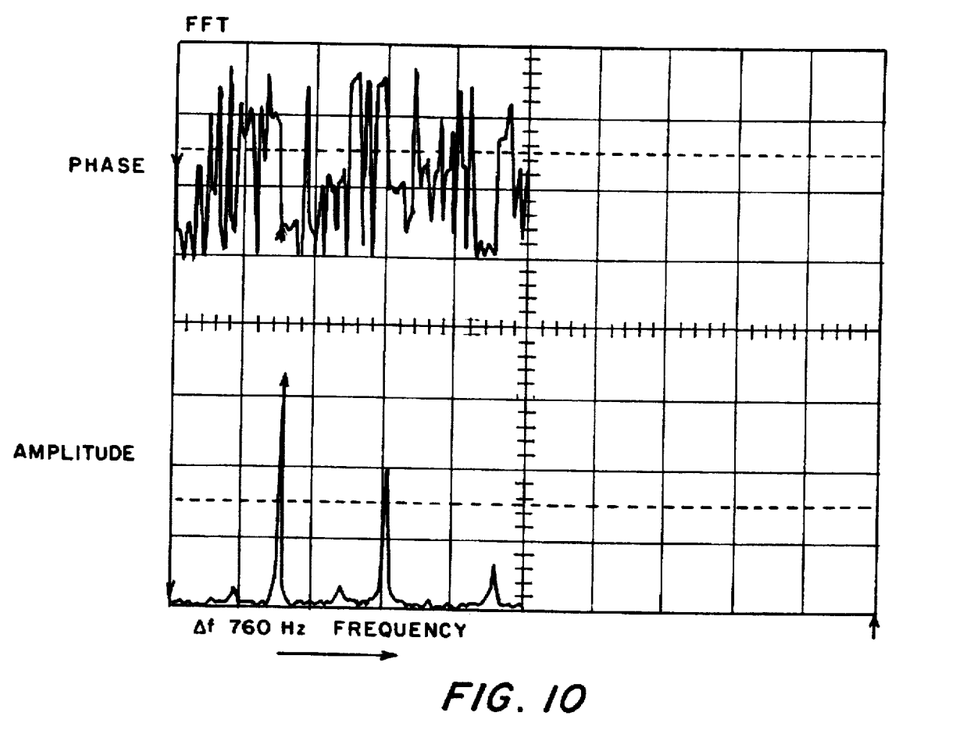
FIG. 10 shows fourier transform and phase angle outputs of frequency domain operation, according to Example 1.

FIG. 10 shows the outputs of frequency domain operation. The lower trace shows the fast Fourier transform of a detector output such as the detector output shown in FIG. 7. The fundamental and harmonic peaks stand out clearly. Several small peaks, artifacts of the finite sampling performed for the experiment, can also be observed. The small amplitude of these artifacts assures that they can be readily distinguished from the signal. The upper trace shows the phase of the lower trace. Selecting the deflection associated with peaks in the frequency domain spectrum permits localization of the edges of the fiducials.

Obviously, many modifications and variations of the present invention are possible in light of the above teachings. It is therefore to be understood that, within the scope of the appended claims, the invention may be practiced otherwise than as specifically described.

What is claimed is:

1. A fiducial electron beam detector, comprising:
   an electron beam absorber layer, having one or more apertures therethrough, said one or more apertures adapted for the transmission of said electron beam;
   a conductive or semiconductive structure adapted to produce a current in response to an incident low dose electron beam, said low dose electron beam being adapted for producing said current at a dose less than a dose than will fog an electron beam resist, said structure positioned for detecting said electron beam transmitted through said one or more apertures; and
   means for delivering said low dose electron beam to said conductive or semiconductive structure through said apertures.

2. The fiducial electron beam detector of claim 1, further comprising means for detecting said current.

3. The fiducial electron beam detector of claim 1, wherein said one or more apertures comprises a plurality of apertures.

4. The fiducial electron beam detector of claim 3, wherein said plurality of apertures comprises a plurality of regularly spaced apertures.

5. The fiducial electron beam detector of claim 4, wherein said plurality of regularly spaced apertures comprises a two dimensional grid of apertures.

6. The fiducial electron beam detector of claim 3, wherein each of said plurality of said apertures are between about 10% and about 1000% as wide as the FWHM width of said electron beam.

7. The fiducial electron beam detector of claim 3, wherein each of said plurality of said apertures are between about 10 nm and about 100 nm wide.

8. The fiducial electron beam detector of claim 3, wherein said electron beam absorber layer comprises a nanopore glass.

9. The detector of claim 1, wherein said detector is removable from a workpiece adapted for patterning by an electron beam.

10. A fiducial electron beam detector, comprising
    a first semiconductor layer adapted for electron collection;
    a first diode layer contacting a bottom surface of said first semiconductor layer; and
    a first responsive layer comprising essentially parallel lines of conductive material oriented in an x direction, said conductive lines separated by nonconductive material, wherein each of said lines is adapted for producing a current responsive to said electron beam, said first responsive layer contacting a bottom surface of said first diode layer.

11. The fiducial electron beam detector of claim 10, further comprising:

a second diode layer contacting a bottom surface of said first responsive layer;

a second semiconductor layer adapted for electron collection, said second semiconductor layer contacting a bottom surface of said second diode layer;

a third diode layer contacting a bottom surface of said second semiconductor layer; and a second responsive layer comprising essentially parallel lines of conductive material oriented in a y direction, said conductive lines separated by nonconductive material, wherein each of said lines is adapted for producing a current responsive to said electron beam, said second responsive layer contacting a bottom surface of said third diode layer.

12. The fiducial electron beam detector of claim 10, further comprising means for detecting current in said conductive lines.

13. A method for monitoring the travel of an electron beam on a substrate, in an area wherein said beam can create a useful image on said substrate with submicron precision, said electron beam generated by an electron beam source, comprising:

positioning a fiducial electron beam detector comprising a fiducial pattern relative to said substrate, so that said fiducial pattern is adjacent and parallel to an area on said substrate where said beam can create useful image with submicron precision, opposing said electron beam source, wherein said fiducial electron beam detector comprises means for directly detecting primary electrons from said electron beam;

exposing said substrate to said beam, wherein the dose delivered by said electron beam is sufficiently high to generate a detected signal in said means for directly detecting primary electrons from said electron beam, said signal being representative of the relative fiducial pattern and said travel, and wherein the dose delivered by said electron beam is less than a dose required to create a useful image on said substrate, and is thereby sufficiently low to prevent fogging in said substrate; and comparing said detected signal with a predetermined signal to provide a position signal representative of the beam travel with submicron precision.

14. The method of claim 13, wherein said step of exposing said substrate to said beam comprising moving said beam across said film.

15. The method of claim 14, wherein said step of moving said beam across said film comprises moving said beam across said film at a selected rate.

16. The method of claim 15, wherein said selected rate is a selected constant rate.

17. The method of claim 13, wherein said means for directly detecting primary electrons from said electron beam comprises a conductive or semiconductive electrode for conducting electrons from said electron beam.

18. A method for monitoring the travel of an electron beam on a substrate, in an area wherein said beam can create a useful image on said substrate with submicron precision, said electron beam generated by an electron beam source, comprising:

positioning a fiducial electron beam detector comprising a fiducial pattern relative to said substrate, so that said fiducial pattern is adjacent and parallel to an area on said substrate where said beam can create useful image with submicron precision, opposing said electron beam source, wherein said fiducial electron beam detector comprises means for directly detecting primary electrons from said electron beam;

exposing said substrate to said beam, wherein the dose delivered by said electron beam is sufficiently high to generate a detected signal in said means for directly detecting primary electrons from said electron beam, said signal being representative of the relative fiducial pattern and said travel; and comparing said detected signal with a predetermined signal to provide a position signal representative of the beam travel with submicron precision;

wherein said step of exposing said substrate to said beam comprising moving said beam across said film;

wherein said step of moving said beam across said film comprises moving said beam across said film at a selected rate;

wherein said selected rate is a selected constant rate; and further comprising the step of performing a Fourier transform on said detected signal to generate a frequency domain detected signal.

\* \* \* \* \*